United States Patent
Jansson

(10) Patent No.: US 10,444,804 B2
(45) Date of Patent: Oct. 15, 2019

(54) ELECTRONIC TERMINAL

(71) Applicant: AAC Technologies Pte. Ltd., Singapore (SG)

(72) Inventor: Daniel Jansson, Shenzhen (CN)

(73) Assignee: AAC Technologies Pte. Ltd., Singapore (SG)

(*) Notice: Subject to any disclaimer, the term of this patent is extended or adjusted under 35 U.S.C. 154(b) by 0 days.

(21) Appl. No.: 15/955,821

(22) Filed: Apr. 18, 2018

(65) Prior Publication Data
US 2019/0220068 A1    Jul. 18, 2019

(30) Foreign Application Priority Data
Jan. 12, 2018 (CN) .......................... 2018 1 0032540

(51) Int. Cl.
*G06F 1/16* (2006.01)
*G06F 3/041* (2006.01)
*H03K 17/96* (2006.01)

(52) U.S. Cl.
CPC ............ *G06F 1/1692* (2013.01); *G06F 3/041* (2013.01); *H03K 17/96* (2013.01); *G06F 2203/04105* (2013.01)

(58) Field of Classification Search
CPC ......... G06F 2203/04105; G06F 1/1692; G06F 3/041; H03K 17/96
See application file for complete search history.

(56) References Cited

U.S. PATENT DOCUMENTS

| 2016/0241767 A1* | 8/2016 | Cho | H04N 5/23203 |
| 2018/0067639 A1* | 3/2018 | Balaram | G06F 3/04883 |
| 2019/0094849 A1* | 3/2019 | Kim | H04W 4/029 |

* cited by examiner

*Primary Examiner* — Muhammad N Edun
(74) *Attorney, Agent, or Firm* — IPro, PLLC; Na Xu

(57) ABSTRACT

The present invention relates to electronic technology and discloses an electronic terminal, which includes a shell, a processor and a screen inside the shell. The electronic terminal includes also a virtual key at the edge of the shell. The virtual key includes a sensor and touch marks on the shell. The touch marks are set on the shell at the position where the sensor is set. The touch mark provides different touch feeling so as to indicate the position of the sensor. The electronic terminal disclosed by the present invention has the advantages of compact structure and high integrity.

9 Claims, 2 Drawing Sheets

ELECTRONIC TERMINAL

FIELD OF THE PRESENT DISCLOSURE

The present invention relates to electronic technology, specially involving an electronic terminal.

DESCRIPTION OF RELATED ART

Mobile phone and other electronic terminal have become indispensable belongings at present. As electronic terminals such as mobile phone are developed rapidly, people's requirement on them is increasingly high and the functions are becoming more and more powerful. In order to ensure that electronic terminals can have more and more functions, the operation is becoming more and more complicated, and more keys are also needed. The keys of electronic terminals at present are set at the side of terminal shell, including the key cap on the electronic terminal shell and metal dome under the key cap. The user operates the keys by pressing down the metal dome through the key cap.

However, the inventor of present invention finds that the key cap structure outside the electronic terminal shell is against the compact and fluent design trend of electronic terminal at present, leads to the complex appearance of electronic terminal and lack of integrity.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

Figure 1:
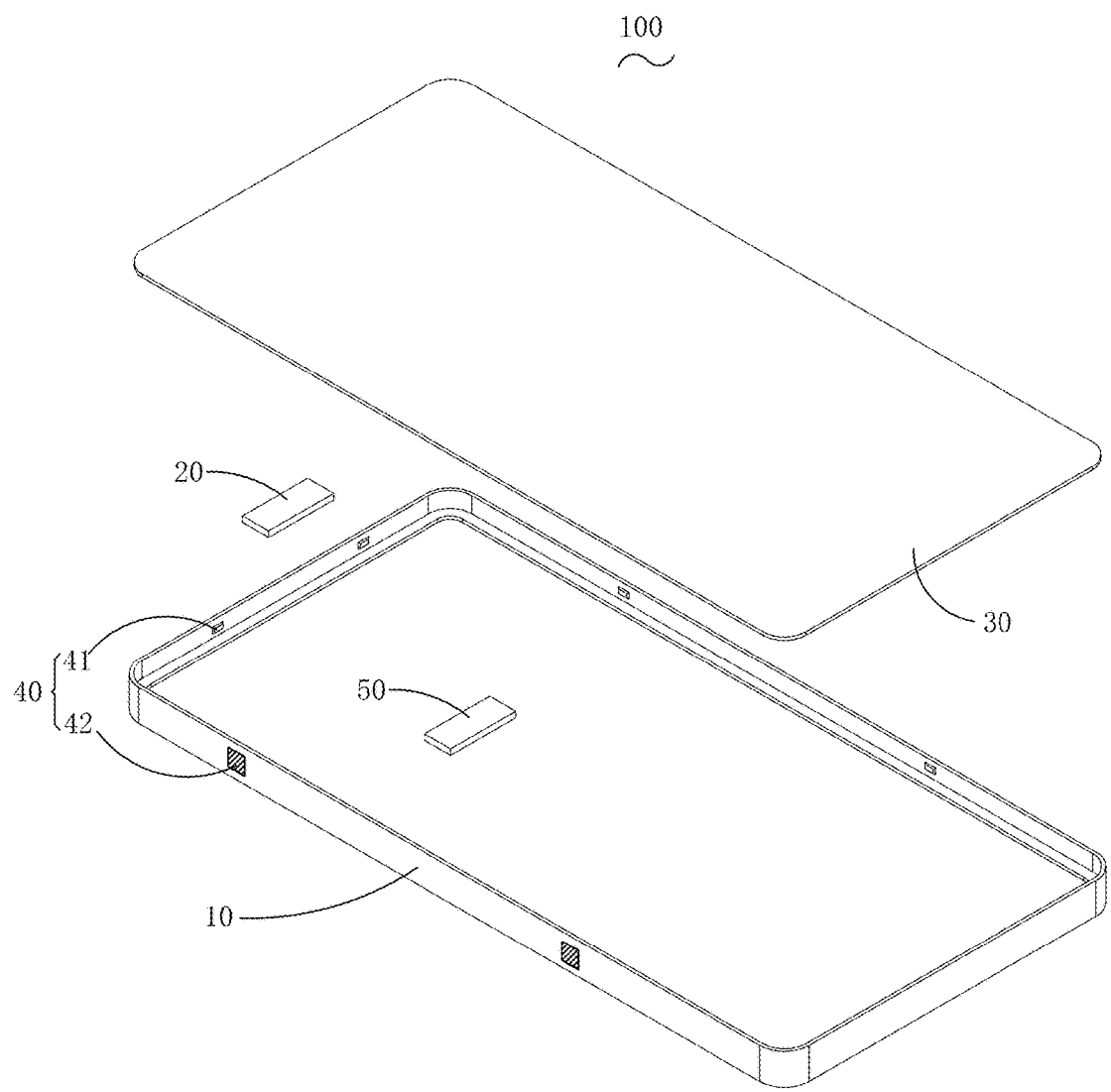
FIG. 1 is an isometric and exploded view of an electronic terminal in accordance with an exemplary embodiment of the present invention.
Figure 2:
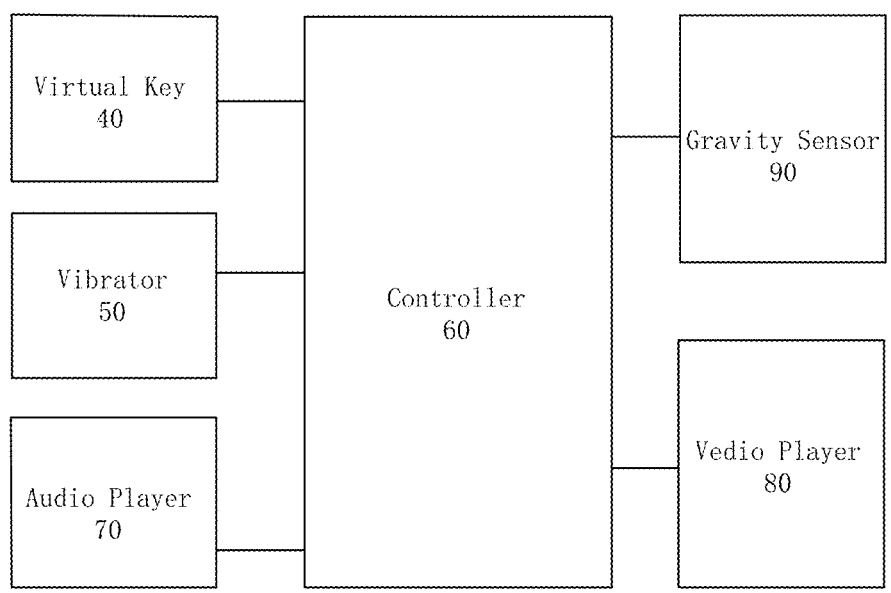
FIG. 2 is an illustrative structural module of the electronic terminal in FIG. 1.

The exemplary embodiment of the present invention relates to an electronic terminal 100. As shown in FIG. 1, the electronic terminal 100 includes a shell 10, a processor 20 and a screen 30. The processor 20 and screen 30 are located in the shell 10. The electronic terminal 100 includes also a virtual key 40 at an edge of the shell 10. The virtual key 40 includes a sensor 41 and a touch mark 42 on the shell 10. The touch mark 42 on the shell 10 indicates the position of the sensor 41 and provides touch feeling different to other areas of the shell 10, so as to indicate the position of the sensor 41.

Compared with the existing technology, the virtual key 40 including the sensor 41 is provided at the edge of the shell 10 of the electronic terminal 100 of this embodiment. The sensor 41 is operated by the virtual key, instead of the key cap and metal dome used in the existing technology, avoiding the problem that the key cap is convex installed and exposed outside the shell 10 as the pressing stroke space of the key cap. The electronic terminal 100 looks compact and integral.

The structure of the electronic terminals 100 in this embodiment will be described in details as follows, but this description is just one of feasible embodiment of the present invention. In practical application, the form and details of the structure can be changed, not just limited to the following specific structure.

In this embodiment, the sensor 41 is a pressure sensor. Specifically, when the user wants to use the virtual key 40, the user just presses down slightly the surface of the shell 10 where the virtual key 40 is located. The pressure sensor can detect the operation of the virtual key and transmits the operation signal to the processor 20 of the electronic terminal. The processor 20 calls the functions corresponding to the operation of the virtual key. Understandably, the sensor 41 can also be a touch sensor. When the user touches the area of the sensor 41, the sensor 41 can detect the operation of the virtual key and the user does not need to press the virtual key, so as to prevent the interference on the operation detection caused by different pressing forces of different users. In addition, the sensor 41 can also be a slip sensor. When the user's finger slips on the area of the sensor 41, the sensor 41 can detect the operation of the virtual key, so as to realize slip operations, for example, moving web progress bar, controlling media operation progress etc. It is appreciated that the sensor 41 can also be other types of touch sensor, so different types of sensors can realize specific key functions, which are not described in detail here.

In this embodiment, the sensor 41 is fixed on the shell 10 through metal frame. Understandably, the metal frame in this embodiment is used only for fixing the sensor 41, so the type of material is not specified strictly, metal frame, glass frame and plastic frame all can be used for fixing and can be changed according to actual design.

In addition, the surface mark 42 can indicate the position of the sensor 41. Its touch feeling is different to other areas on the shell 10, so that the user can find easily the position of the virtual key 40 for operation. The surface mark 42 is a bulge, depression, micro lines, rough surface or polished surface on the shell 10. The bulge, depression, micro lines, rough surface or polished surface above are only the examples of some proposals of the surface mark 42, but not limited to the proposals above.

The electronic terminal 100 includes also a vibrator 50 connected to the shell 10 and a controller 60 connected to the vibrator 50. The controller 60 controls the vibrator 50 according to the preset control program, so that the vibrator 50 vibrates together with the shell 10 to output feedback signal when the sensor 41 detects the key operation. Specifically, when the sensor 41 detects the key operation from the user, the sensor 41 will transmit the key operation signal to the controller 60. After the controller 60 receives the key operation signal, the controller 60 will control the vibrator 50 for vibrating according to the key operation signal, thereby driving the shell 10 for vibration. The user feels the vibration of the virtual key 40, thereby knows whether the key operation has been detected, so as to prevent wrong operation by the user by repeatedly pressing the virtual key 40 when the user does not know whether the key operation is successful or not.

Preferably, in system setting of the electronic terminal 100, the user can also close/open vibration feedback at any time. The vibration of the vibrator 50 can be set by the user, so the feedback function of the electronic terminal is more flexible and the user's experience is improved.

Similar to the vibrator 50, the electronic terminal 100 includes also an audio player 70 and/or a video player 80. When the sensor 41 detects key operation, the player can play audio and/or video information at same time, so as to realize the audio feedback and/or video feedback. It is an additional method for confirming if the key operation is successful or not. The users can select this function by themselves, meeting diversified demand of the users.

The virtual key 40 is located at the edge of the shell 10 and can include several virtual keys. Several virtual keys 40 are connected to the controller 60 and the controller 60 can selectively open or close the key operation function of each virtual key 40 according to the habit of the user. Specifically, the key operation function of each virtual key 40 can be opened/closed at any time. In actual use process, the users can selectively open/close the key operation function of the virtual keys 40 according to their own habits of operation, more convenient and comfortable, greatly improving the user's experience.

Further, when the sensor 41 detects the key operation, the processor 20 activates the corresponding function of the virtual key 40 in accordance with the customized function setting. Specifically, each virtual key 40 is not one-to-one correspondence to the function of the electronic terminal 100. The corresponding function can be set freely. For example, virtual key 1 can be set to open the camera, can also be set to open the mailbox, picture gallery and other application programs. As a matter of fact, one function of the electronic terminal can also be corresponding to several virtual keys 40. These functions are set in the system or customized by the user in the application program, increasing function diversity of the virtual key 40 and meeting user's demand on more functions of the terminal 100.

Preferably, the electronic terminal 100 also includes a gravity sensor 90. The gravity sensor 90 can detect the placement direction of the electronic terminal 100 at any time. When the change of placement direction of the electronic terminal 100 is detected, the processor 20 can automatically adjust the layout of the virtual key 40. For example, the virtual key A is corresponding to function a before location change. When the change of placement direction of the electronic terminal 100 is detected, the processor 20 will automatically transfer the function a to the virtual key B, in which, the relative positions of the virtual key A and virtual key B are same before and after the placement direction of the electronic terminal 100 is changed, so no matter what state of the electronic terminal is, the layout of the virtual key 40 can be adjusted to the same layout before the placement state is changed, meeting the user's specific key operation habit and avoiding the problem that the user cannot operate quickly and accurately the virtual key 40 in accordance with the previous habits after the placement state of the electronic terminal is changed, and improving the user's experience.

The general technical personnel in this field can understand that the embodiments above are the embodiment samples of the present invention. In practical application, the form and details of the embodiments can be changed without deviating from the spirit and scope of the present invention.

It is to be understood however that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. An electronic terminal, including:
a shell;
a processor;
and a screen accommodated in the shell;
at least one virtual key arranged at an edge of the shell; wherein
the at least one virtual key includes a sensor and touch marks set on the shell at an area of the sensor for providing touch feeling different from other areas of the shell for indicating the position of the sensor;
a gravity sensor;
a controller connected to the virtual keys, as well as several virtual keys on the edges of the shell;
wherein the gravity sensor detects the placement status of the electronic terminal and the controller adjusts the layout of the virtual keys according to the placement status of the electronic terminal.

2. The electronic terminal as described in claim 1, wherein the sensor includes one or more pressure sensors.

3. The electronic terminal as described in claim 1, wherein the shell includes a metal frame or a glass frame, the sensor is fixed on the metal frame or glass frame.

4. The electronic terminal as described in claim 1, wherein the touch marks are set on a bulge, depression, rough surface or polished surface on the shell.

5. The electronic terminal as described in claim 1 further including a vibrator connected to the shell and a controller connected to the vibrator, the controller controls the vibrator according to preset control operation, so that the vibrator drives the shell and vibrates together with the shell to output feedback signal when the sensor detects key operation.

6. The electronic terminal as described in claim 5, wherein the controller selectively controls the vibrator according to self-set control operation, so that the vibrator stops vibration when the sensor detects key operation.

7. The electronic terminal as described in claim 5 further including an audio player and/or a video player, the controller controls the audio player and/or video player according to the preset control operation, so that the audio player and/or video player outputs audio feedback and/or video feedback when the sensor detects the key operation.

8. The electronic terminal as described in claim 1, wherein the shell edge includes two sides set oppositely for users to hold the electronic terminal, the electronic terminal includes several virtual keys on both edges of the shell, the controller is connected to the virtual keys and can selectively open or close the key operation function of each virtual key according to the habit of the user.

9. The electronic terminal as described in claim 1, wherein the processor activates the current corresponding function of the virtual key in accordance with the customized function setting when the sensor detects the key operation.

* * * * *